(12) United States Patent
Ballantine et al.

(10) Patent No.: US 6,552,411 B2
(45) Date of Patent: Apr. 22, 2003

(54) DC OR AC ELECTRIC FIELD ASSISTED ANNEAL

(75) Inventors: Arne W. Ballantine, Round Lake, NY (US); John J. Ellis-Monaghan, Grande Isle, VT (US); Toshihura Furukawa, Essex Junction, VT (US); Jeffrey D. Gilbert, South Burlington, VT (US); Glenn R. Miller, Essex Junction, VT (US); James A. Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 09/809,887

(22) Filed: Mar. 16, 2001

(65) Prior Publication Data

US 2001/0026999 A1 Oct. 4, 2001

Related U.S. Application Data

(63) Continuation-in-part of application No. 09/538,309, filed on Mar. 30, 2000, now Pat. No. 6,274,465.

(51) Int. Cl.[7] .............................................. H01L 29/00
(52) U.S. Cl. ..................... 257/530; 257/530; 257/422; 438/510; 438/659; 438/660; 438/514; 438/572; 118/500; 204/164
(58) Field of Search ............................... 257/442, 530; 438/510, 514, 659; 204/164

(56) References Cited

U.S. PATENT DOCUMENTS

| | | | | |
|---|---|---|---|---|
| 5,463,244 A | * | 10/1995 | De Araujo et al. | 257/530 |
| 6,274,465 B1 | * | 3/2000 | Ballantine et al. | 438/510 |
| 6,374,005 B2 | * | 2/2002 | Hung | 385/14 |

\* cited by examiner

*Primary Examiner*—David Nelms
*Assistant Examiner*—Renee R. Berry
(74) *Attorney, Agent, or Firm*—Connolly Bove Lodge & Hutz, LLP; William D. Sabo

(57) ABSTRACT

A method for forming a desired junction profile in a semiconductor device. At least one dopant is introduced into a semiconductor substrate. The at least one dopant is diffused in the semiconductor substrate through annealing the semiconductor substrate and the at least one dopant while simultaneously exposing the semiconductor substrate to an electric field.

21 Claims, 14 Drawing Sheets

DC OR AC ELECTRIC FIELD ASSISTED ANNEAL

This is a continuation-in-part of U.S. patent application Ser. No. 09/538,309, filed Mar. 30, 2000 now U.S. Pat. No. 6,274,465, entitled "DC Electric Field Assisted Anneal", disclosure of which is incorporated herein by reference.

FIELD OF THE INVENTION

The present invention relates to a method and device for controlling the diffusion of dopants in a semiconductor substrate.

BACKGROUND OF THE INVENTION

As semiconductor device structure sizes shrink, greater and greater control must be excised to control the formation of the ever shrinking structures. The location and dimensions of the smaller and smaller structures require careful control to ensure proper placement. At the minute dimensions involved, small errors in misplacement and/or size of structures formed can result in non-functional or misfunctioning devices. Processes involved in semiconductor device manufacture require ever increasing levels of precision to create the desired structures.

Rapid thermal processing is widely used for diffusing dopants in a semiconductor substrate. At the present time for rapid thermal processing, a radiation source, such as a lamp or a hot plate, is used to rapidly heat a workpiece to the desired temperature. That radiation source is then used to maintain the workpiece at that temperature. The radiation source is then used to rapidly cool the workpiece in a controlled fashion. During each of these steps of the typical process, wafer temperature is sensed (either with a pyrometer sensing the infrared radiation of the workpiece or with a thermocouple) and used to provide feedback control of the temperature. When a workpiece is raised to a temperature of sufficient magnitude, diffusion of species within the workpiece begins. Further, the rate of such diffusion is a strong function of the workpiece temperature. Also, the extent of any diffusion is a factor of both temperature magnitude and time-at-temperature. Therefore, when the workpiece is a semiconductor wafer, and the thermal process is a rapid thermal process used for activation annealing of a dopant species, in order to achieve a uniform activation and diffusion of dopant atoms at all sites on the semiconductor wafer, precise control of the temperature of the wafer is essential.

In the more recent silicon-on-insulator technology, it will be desirable to control the diffusion of dopants to a better than 3° C. 3-sigma temperature control. However, because of the limitation in the state of the art rapid thermal processing equipment, only a 5–6° C. 3-sigma temperature control can be achieved at the present time. A number of factors exist that contribute to the temperature control problem. These include the chamber gas flow the chamber doors and robotics, the wafer centering, and slow rate limitation of the lamp heating.

Concerning chamber gas flow, a thermal gradient across the wafer exists due to process gas distribution. In rapid thermal processing equipment, a process gas is introduced (either reactive or inert). The rapid thermal processor is not a thermal equilibrium system (only the workpiece and its support structures are heated). Therefore, the incoming gas is cold, but the gas heats as it travels across the wafer and exits the chamber. This factor creates a temperature gradient of colder temperature near the gas inlet and warmer temperature near the gas outlet on chamber components. That gradient is transferred to the wafer when the wafer is placed into the chamber. Wafer rotation is used to mitigate this effect. However, in state of the art systems equipped with wafer rotation, while this effect is mitigated, it still leaves a distinct signature in that a wafer-rotational period oscillation in temperature is very evident in the signal of fixed pyrometers. This oscillation cannot be damped out because of a lack of lamp zone control, and therefore results in local hot and cold spots on the wafer edge. These hot and cold spots have been directly linked to chips which do not meet performance criteria.

In addition, a thermal gradient across the wafer exists due to chamber door and wafer handling equipment. In a similar fashion as mentioned above, since a door must be placed in a processing chamber, and since robotic handlers must insert the workpiece through that door, a cooling effect on chamber internals occurs at the door. Cold gases from the transfer chamber or room air cool the door region; and the robot handler end piece acts as a heat sink and cools the door region. Accordingly, hot and cold spots are created, which are linked to chips which do not meet performance criteria.

In the current state of the art, rapid thermal processors support the wafer with a pocketed ring (full edge contact). Hot and cold spots on the wafer edge are known to be created if wafer centering in that support "edge ring" is not accurate to within 0.010–0.015 inches. The wafer rotation used to correct for thermal non-uniformities creates a metastable condition, where any sufficient perturbation of the wafer will result in the wafer centripetally accelerating until it is as off-center as possible. Thus, hot and cold spots due to wafer positioning are often created. These, too, have been directly linked to chips, which have not met their performance criteria.

With respect to slew rate limitations of lamp heating, because W-halogen lamps are built with some kind of enclosure to contain the gas, that enclosure stores a significant amount of heat. This stored heat dampens any high frequency signal, which might be driven into the lamps. And, as chamber rotation speeds increase with rapid thermal processor design evolution (200 mm tools rotate at 90 RPM; 300 mm tools will rotate at 150 to 300 RPM), it becomes increasingly difficult to dampen rotation related temperature oscillations with controlled lamps.

The current state of the art of rapid thermal processing technology suffers from limitation of dopant diffusion and thermal budget matching. Concerning diffusion limitations, many technologies make use of very heavy and shallow dopant implants with follow-on anneal for activation and diffusion to achieve a shallow uniform dopant profile. Because of the extent of the diffusion required, very high temperature batch furnace are necessarily utilized. However, these processes present a problem—particularly as wafer size increases because at high temperature batch furnaces produce wafer slip. Thus, it would be desirable to provide a means of increasing the overall anneal diffusion rate so that a single wafer rapid thermal anneal process becomes practical.

Concerning thermal budget matching, an object of some current manufacturing line practices is to qualify both batch and single wafer hot processes for all steps. For example, it is desired to be able to form spacer nitride films in both a batch furnace CVD processor and a single wafer rapid thermal CVD processor. But, since the batch tool keeps a set of 125 wafers at a temperature of about 750° C. for over an hour, the single wafer processor keeps each wafer at about 750° C. for only two minutes. The end result is that the device characteristics of transistors formed with batch nitride depositions differ from those of transistors formed with single wafer depositions. The reason for the difference is that the diffusion resulting from time-at-temperature is significantly different between the two systems. Therefore, a means of increasing the total diffusion of the single wafer process, while keeping the same thermal profile would be desirable.

SUMMARY OF THE INVENTION

The present invention concerns a method for forming a desired junction profile in a semiconductor device. At least one dopant is introduced into a semiconductor substrate. The at least one dopant is diffused in the semiconductor substrate through annealing the semiconductor substrate and the at least one dopant while exposing the semiconductor substrate to a DC and/or AC electric field.

The present invention also relates to a device for forming a desired junction profile in a semiconductor substrate. The device includes means for annealing a semiconductor substrate in which at least one dopant has been diffused. The annealing means includes at least one heat source. The device also includes means for producing a DC and/or AC electric field and exposing the semiconductor substrate to the DC and/or AC electric field simultaneous with the annealing.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

BEST AND VARIOUS MODES FOR CARRYING OUT THE INVENTION

Figure 1A:
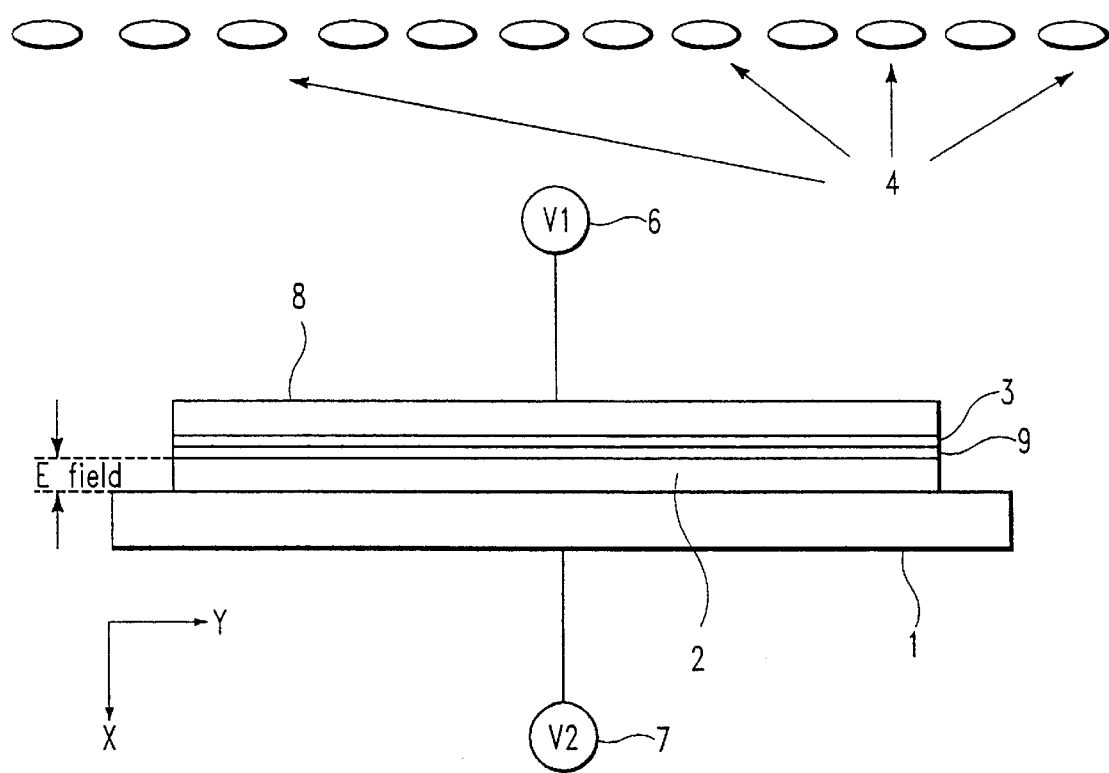
FIGS. 1a, 1b, 1c, and 1d represent cross-sectional views of four different embodiments of arrangements according to the present invention.

The present invention provides a process and apparatus for more controllable and more manufacturable production of such shallow junctions in an industrial RTA tool. With the present invention, the dopants may be activated to form the shallow junctions that are necessary now and in the future. Along these lines, the present invention permits control of dopant diffusion by retarding or enhancing the thermal diffusion on a local scale by means of an electric field "assist".

The present invention provides a method for forming a desired junction profile in a semiconductor device. At least one dopant is introduced into a semiconductor substrate, such as a silicon wafer. Any suitable method may be utilized for introducing the dopant(s) into the semiconductor substrate. Typically, ion implantation is utilized to introduce the dopant(s). The present invention may be useful in a variety of stages in the process of semiconductor device manufacture where dopant activation/diffusion takes place.

After introduction of the dopant(s) into the semiconductor substrate, the dopant(s) are activated through subjecting the semiconductor substrate and the dopant(s) to an annealing process. Simultaneous with the annealing, the semiconductor substrate and dopant(s) are exposed to a DC and/or AC electric field.

In the context of the present invention, the anneal is typically carried out as a rapid thermal anneal (RTA). RTA and other rapid thermal processes are becoming widely used in semiconductor device manufacture to create certain structures. RTA processes typically include short process times, and particularly short times at a maximum temperature.

According to the present invention, the annealing typically takes place at a temperature of about 900° C. to about 1150° C.

The temperature of the substrate is typically ramped up from about room temperature to a maximum processing temperature over a period of about 3 seconds to about 10 seconds. Typically, the temperature is ramped up to the maximum processing temperature as quickly as possible. The temperature typically plateaus one or more times during the time that the temperature is ramped up to the maximum, dwelling at the plateau(s) for a period of time.

Typically, the temperature is maintained at the maximum for a time of about 0.5 seconds to about 10 seconds. The temperature may remain at the maximum for one period of time or may dip below the maximum for one or more time periods, returning to the maximum.

After the desired processing time at the maximum temperature, the temperature of the semiconductor substrate is ramped down. Typically, the temperature is ramped down as quickly as possible. Along these lines, the temperature is typically ramped down to about room temperature over a period of about 10 seconds to about 60 seconds.

Additionally, the annealing according to the present invention typically takes place for a time of about 0.5 seconds to about 10 seconds.

Also, the pressure that the annealing takes place at may vary. According to the present invention, the pressure within a rapid thermal processing tool may depend upon the electric field applied. Along these lines, the pressure may be reduced to help prevent arcing and/or electric discharge. This will be clarified below.

During the anneal, the present invention utilizes an applied electric field to control diffusion of the dopant(s). Controlling diffusion can include enhancing and retarding diffusion. In spite of the discussion above regarding forming extremely shallow junctions, in certain instances, it may be desirable to enhance diffusion of dopants.

According to one embodiment of the present invention, a temporarily and spacially varying electric field is introduced to the rapid thermal processing chamber. This electric field is then used to counter the thermal effects discussed above as specific elements of the thermal processing temperature control problem, and/or this electric field is used to adjust the amount of diffusion which will occur to address the specific technology limitations discussed above.

Applying, an AC, or "alternating current," electric field will enhance dopant diffusion in both directions of the field alternation. When a AC electric field is applied during a rapid thermal process, total diffusion is increased.

As discussed above, chamber gas flow; chamber doors and robotics; and wafer centering issues create temperature non-uniformities which are oscillatory functions with wafer rotation speed as the frequency. Pyrometers can be used to detect these temperature oscillations, however, lamp control systems are unable to compensate for such oscillations. According to the present invention, an AC field generator is installed in the processing chamber in a position such that field lines will penetrate the workpiece surface and act on dopants. In particular, the field generator is positioned so that an AC electric field can be generated near the wafer edge. This can be accomplished with a small device which creates an electric field in only one region of the chamber. Then, using the pyrometer signal as a control means, the AC field strength is oscillated at wafer rotation frequency, at a phase angle such that when the coldest portion of the wafer passes through the electric field, the electric field is at a maximum. Thus, while control of wafer temperature is not improved, control of total dopant diffusion is improved, resulting in an improvement in Leff control of junction activation annealing, and thereby, improving the control of chip performance. Leff is the electrical channel length of an FET.

When a larger field generator is placed in the chamber, such that a AC field penetrates the workpiece uniformly across its surface, total diffusion during rapid thermal annealing at all points on the wafer is increased. By this method, the effective diffusion or a rapid thermal process is increased. By adjusting the strength of the electric field, total diffusion (or thermals budget) or a single wafer process can be matched to a batch furnace process. The total diffusion during a single wafer process can be increased to make that process a viable option for technology process steps where a high degree of dopant diffusion is required.

The AC field is typically employed at a frequency of about 0.5 HZ to about 60 HZ and more typically about 0.5 HZ to about 2 HZ. The peak-to-peak amplitude of the AC field is typically in the range of about 10,000 v/cm to about 100,000 v/cm.

In a typical arrangement for employing an AC field, the grid of a typical RTA tool is employed as the top electrode and the chuck holding the wafer as the bottom electrode. The intrinsic wafer functions as an electrode for shining light on the wafer being heated. The needed electrical potential can be applied to the intrinsic wafer. A thin metal film on the wafer or on the quartz plate is charged to the desired potential. The field intensity can be varied as a function of position to correct for hot spots and to improve uniformity.

In alternative embodiments, in many semiconductor device structures, only the vertical dopant profile is of particular concern. An example of this would be the vertical bipolar transistor emitter-base junction. In this critical performance determining structure, the amount of diffusion of the emitter poly-silicon dopant down into the base silicon sets the base width. In standard processing the diffusion is controlled only by thermal effects. Therefore, each of the rapid thermal processing chamber limitations degrades process uniformity, and therefore reduces the uniformity of bipolar transistor chip performance. However, with the implementation of the present invention, electric field enhanced diffusion is used to compensate for a lack of thermal diffusion in cold regions of the wafer. Thus, again, the overall performance distribution is tightened. And, in this case, since the diffusion is essentially only vertical, a one-dimensional AC electrical-field, or a DC electrical-field can be used to control the diffusion. However, in each case, since the field strength must be controlled by wafer position and synchronized with wafer rotation, both temporal and spacial variation of the field are required.

Figure 6:
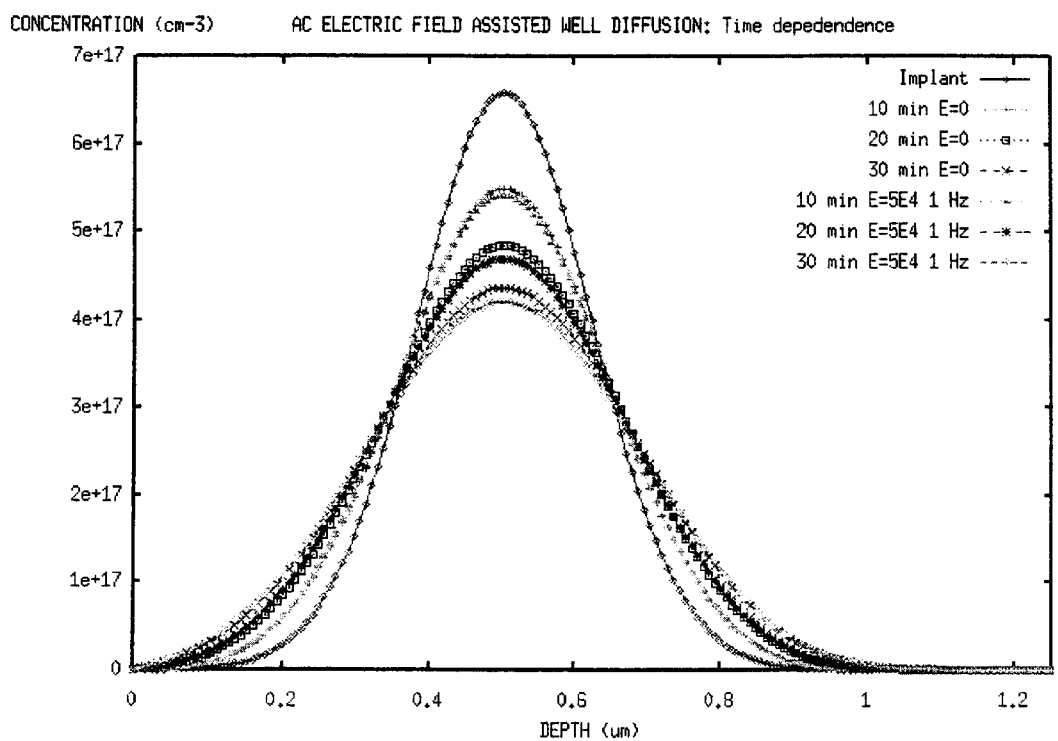
FIG. 6 is a graph showing simulation results for AC electrical field for varying time.

FIG. 6 illustrates simulation results for a 2.0E13 boron well dose at 1000° C. for 20 minutes in a 1 Hz AC electrical field showing the dependence of diffusion for varying time and time at a fixed field strength of 10000 v/cm.

Figure 7:
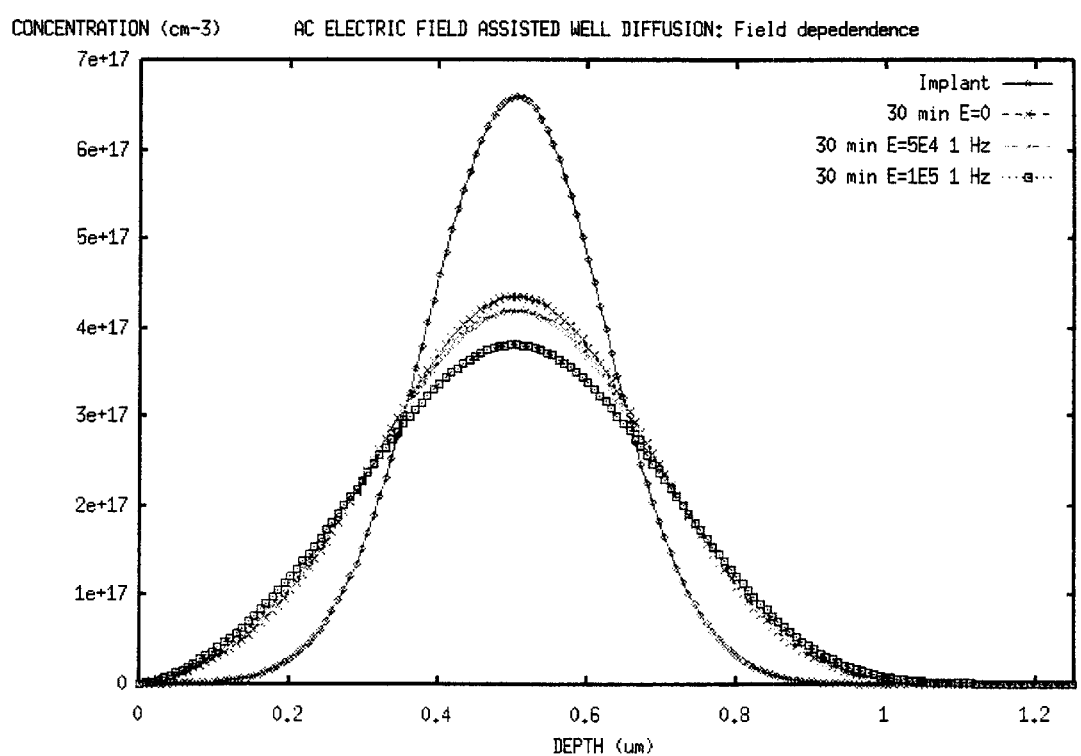
FIG. 7, is a graph showing simulation results and effect of field stress.
Figure 8:
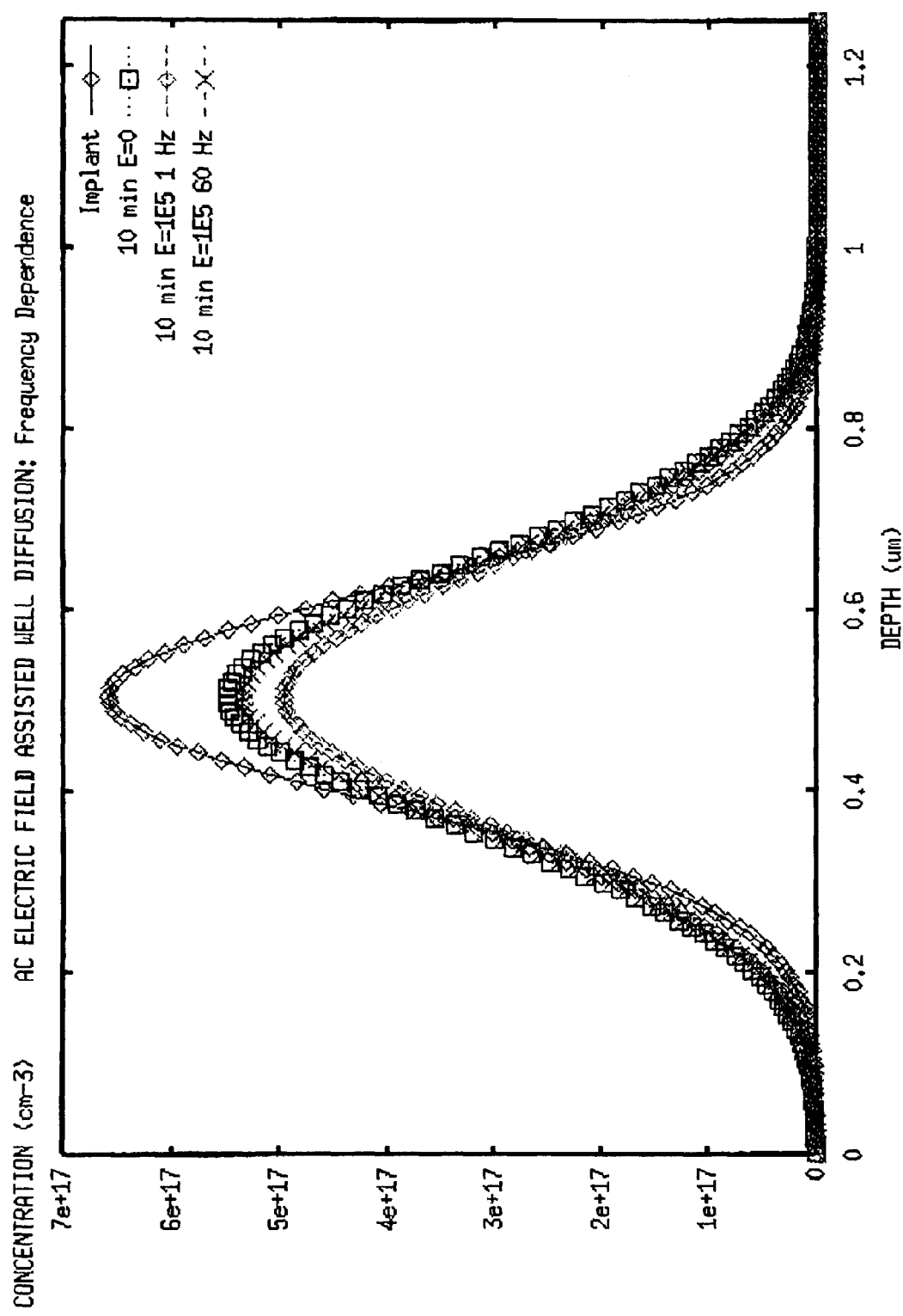
FIG. 8 is a graph showing simulation results for frequencies 1 HZ and 60 HZ.

Illustrated in FIG. 7 is the dependence of diffusion on field strength at a fixed time of 30 minutes. FIG. 8 shows that increased AC field frequency (60 HZ) reduces the diffusion enhancement. Thus optimal performance is achieved below 60 HZ.

In the case of DC current, the diffusion of the dopant(s) may be controlled through control of the characteristics of the applied electric field, show that such as polarity, strength, and/or direction, or angle relative to the normal of the surface of the silicon wafer.

For example, the polarity of the DC electric field may be varied. The polarity of the DC electric field can depend upon the charge of the dopant(s) and the direction that it is desired to affect the movement of the dopant(s). For example, a positive DC electric field may be utilized to retard the diffusion of negative dopants. On the other hand, a positive DC electric field would enhance the diffusion of positive dopants. According to one particular example, if the implanted dopant species is As+, a negative field could be applied to attract the As+ atoms toward the surface. On the other hand, if the implanted dopant species is a negative ion, such as B−, a positive field could be applied to attract the distribution towards the surface. The strength of the applied field may be diminished by free carrier screening. Generally, the screening will be stronger for the case of enhanced diffusion.

The electric field is produced at least in the vicinity of the surface of the semiconductor substrate where the dopants have been introduced. If the semiconductor substrate is being subjected to an anneal and DC electric field in an upright position, then the field is produced at least at the upper surface of the semiconductor substrate. The DC electric field typically extends into the semiconductor substrate. For dopant implants of a dose of about $10^{15}$ cm$^{-2}$, the field screening depth, defined by a depth at which the DC field strength is reduced to 1/e of its magnitude of the silicon surface, is typically about 0.1 $\mu$m to about 0.2 $\mu$m. Controlling the characteristics of the DC electric field at locations in and on the semiconductor substrate will control the diffusion of the dopants.

Every portion of on and under the surface of the semiconductor substrate where the dopant(s) have been introduced may not be subjected to the DC electric field. Alternatively or additionally, regions on and under the surface of the semiconductor substrate where dopant(s) have been introduced may be subjected to DC electric field having varying characteristics. Along these lines, the field strength, direction, and/or other characteristics may differ, depending upon the region in or on the semiconductor substrate. Whether the DC electric field characteristics are the same over the entire surface or below the surface of the semiconductor substrate, the DC electric field characteristics may vary during the carrying out of a method according to the present invention.

It is not necessary that the annealing and exposure to the electric filed be carried out such that they always occur simultaneously. For example, there may be periods, however brief, during which a semiconductor substrate is annealed without exposure to the AC or DC electric field. However, it is necessary to be at the anneal temperature in order that the electric field assist be effective. This is due to the constraints of thermodynamics embodied by the Einstein relationship between the field mobility of the activated dopant atom and its mass diffusion coefficient.

The following equations may be used to describe relationships among thermodynamics, mobility of the dopant species and the mass diffusion, among other factors.

In the equations, it is assumed that CGS units are being utilized. Local flux of dopant may be described by the following equation:

$$\vec{J(x)} = -D(C)\vec{\nabla}C(x) - Z \cdot \mu(x)C(x)\vec{E(x)}$$

wherein x is the distance from the surface of the wafer into the bulk of the wafer;
C(x) is the local number concentration (cm$^{-3}$) of the dopant ion species of interest;
Z is the charge state of the dopant ions;
q is the unit electronic charge;
k is Boltzmann's constant;
T is the wafer temperature in Kelvin;
D is the temperature dependent diffusion coefficient of the dopant species of interest in cm$^2$/sec;
E(x) is the applied electric field strength in V/cm; and
$\mu$ is the mobility of the dopant ion itself, not of the free carrier associated with it.

The Einstein relation between mobility and diffusion coefficient holds as usual (see S. M. Hu, "Diffusion in Silicon" in "Silicon and Germanium" in *Atomic Diffusion in Semiconductors*, D. Shaw, (ed.) Plenum, London (1973), p. 294ff.:

$$\mu(x) = (q/kT) \cdot D(x)$$

Then, the diffusion equation $$(\delta C(x)/\delta t) = \vec{\nabla} \cdot \vec{J(x)}$$

for the dopant species becomes a drift-diffusion equation analogous to that encountered in modeling carrier transport:

$$(\delta C(x)/\delta t) = \vec{\nabla} \cdot (D(x)\vec{\nabla}C(x)) + Z(q/kT)[\vec{\nabla} \cdot (D(x)C(x)\vec{E}(x)]$$

Figure 4:
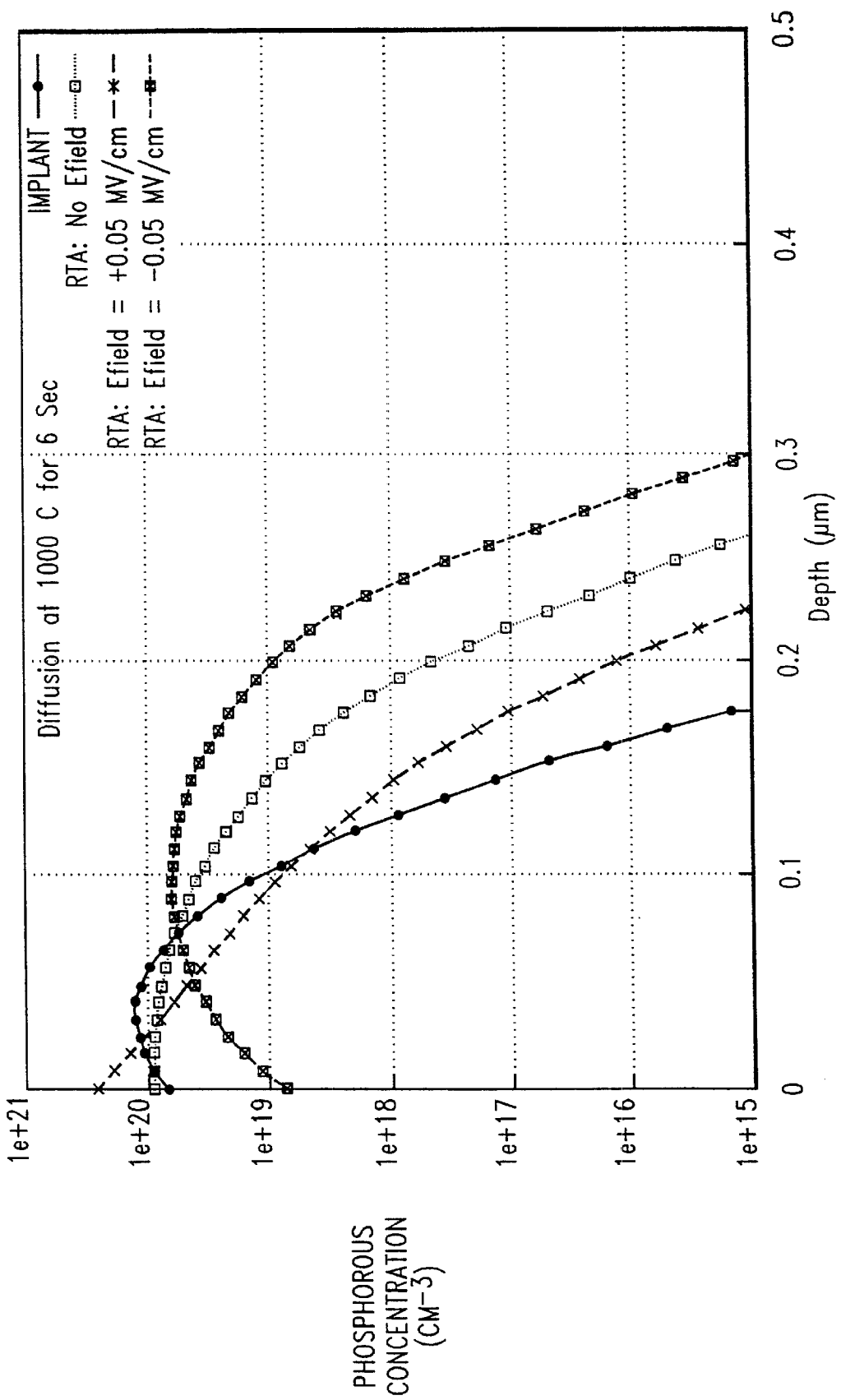
FIG. 4 represents a graph illustrating a relationship between phosphorus dopant concentration in a semiconductor substrate and depth within the semiconductor substrate.

FIG. 4 is a graph illustrating a relationship between phosphorus dopant concentration in a semiconductor substrate and depth into the substrate. Plotted are the implanted dopant profile and the profiles after an anneal at about 1000° C. for about 6 seconds at 0 applied DC field, and +/−0.05 MV/cm. It is noted that the positive field significantly retards the diffusion of the negative phosphorus ion, while the negative field enhances it. In principle, the DC field is screened strongly by the presence of free carriers in accumulation or inversion. This effect is not modeled here. However, for a field strength of 0.01 to 0.5 MV/cm, the carriers will be at worst in weak accumulation or weak inversion. Therefore, the screening effect is small and the above model is applicable.

According to some embodiments of a method according to the present invention, the DC electric field is produced normal to the surface of the semiconductor substrate. According to other embodiments, the DC electric field is produced at an angle with respect to the surface of the semiconductor substrate. Exposing the semiconductor substrate to a DC electric field normal to the surface of the semiconductor substrate can permit control of vertical diffusion of the dopant(s).

Lateral diffusion of the dopant(s) may also be controlled by a DC electric field or one-dimensional AC electrical field, according to the present invention. One way to effect control of lateral diffusion of dopant(s) is to expose the semiconductor substrate to a DC or one-dimensional AC electric field arranged at an angle to the surface of the semiconductor substrate. When utilizing a DC or one-dimensional AC electric field that is at an angle with respect to the surface of the semiconductor substrate, diffusion of the dopant(s), for example, under the edge of a polysilicon FET gate, could be controlled. This can, consequently, permit tuning of the FET device overlap capacitance (Cov).

The angle of the DC or one-dimensional AC electric field with respect to the surface of the semiconductor substrate may vary, depending upon the degree of lateral diffusion desired. For example, a DC or one-dimensional AC electric field at an angle of about 15° relative to the surface of the semiconductor substrate can produce a 25% effect laterally, relative to vertical. In principle, the field angle can vary from 0° to about 90° with respect to a line normal to the surface of the semiconductor substrate. According to such embodiments, the angle of the DC or one-dimensional AC electric field with respect to the surface of semiconductor substrate is sufficient to result in the desired degree of modulation of the lateral diffusion of the dopant(s). However, practical considerations with respect to the proximity of the field source to the surface, herein described, may prevent the angle from exceeding $j_{max} = \tan^{-1}(h/r)$, where h is the height of separation of the field plate from the substrate at the center of the wafer, and r is the radius of the wafer. $J_{max}$ will typically be about less than about 5°.

Rotating the semiconductor substrate during the annealing and exposure to a DC electric field at an angle with respect to the semiconductor substrate can permit a uniform lateral effect, if desired. If the substrate is not rotated, the effect would be biased in the direction of the applied field. This may also be desirable in certain instances.

The DC or AC electric field may be set up in a variety of ways. According to one example, the semiconductor substrate is arranged on an electrically conducting chuck that provides a source of electrical potential. The chuck may include a surface that lies adjacent and contacts the entire bottom surface of the semiconductor substrate, as illustrated in FIG. 1a.

Along these lines, FIG. 1a. represents a cross-sectional view of one embodiment of an apparatus of the present invention. In the arrangement shown in FIG. 1a, a thin layer 3, on the order of about 20 nm to about 500 nm, of tungsten (W) metal has been deposited on a silicon wafer or field source wafer 8. The field source wafer 8 is aligned and brought into horizontal contact, or near contact, with the object silicon wafer 2, which is to be annealed. A thin layer of oxide 9, on the order of about 10 nm to about 100 nm, has been formed on metal layer 3 by the metalization process. The metal-oxide wafer, including field source wafer 8, metal layer 3 and oxide/quartz layer 9, forms one electrode of the electric field source. The underlying metal chuck 1 forms the other electrode. The desired field is generated by applying a DC bias of in the range of about 0 volts to about 5 volts between the electrodes or an AC at a voltage of about 0 V to about 5V and frequency of about 0 HZ to about 60 HZ. Additionally in FIG. 1a, a plurality of lamps 4 are arranged above the chuck 1 and supported wafers. Voltage sources V1 6 and V2 7 are connected to the field source wafer 8 and chuck 1.

Figure 1B:
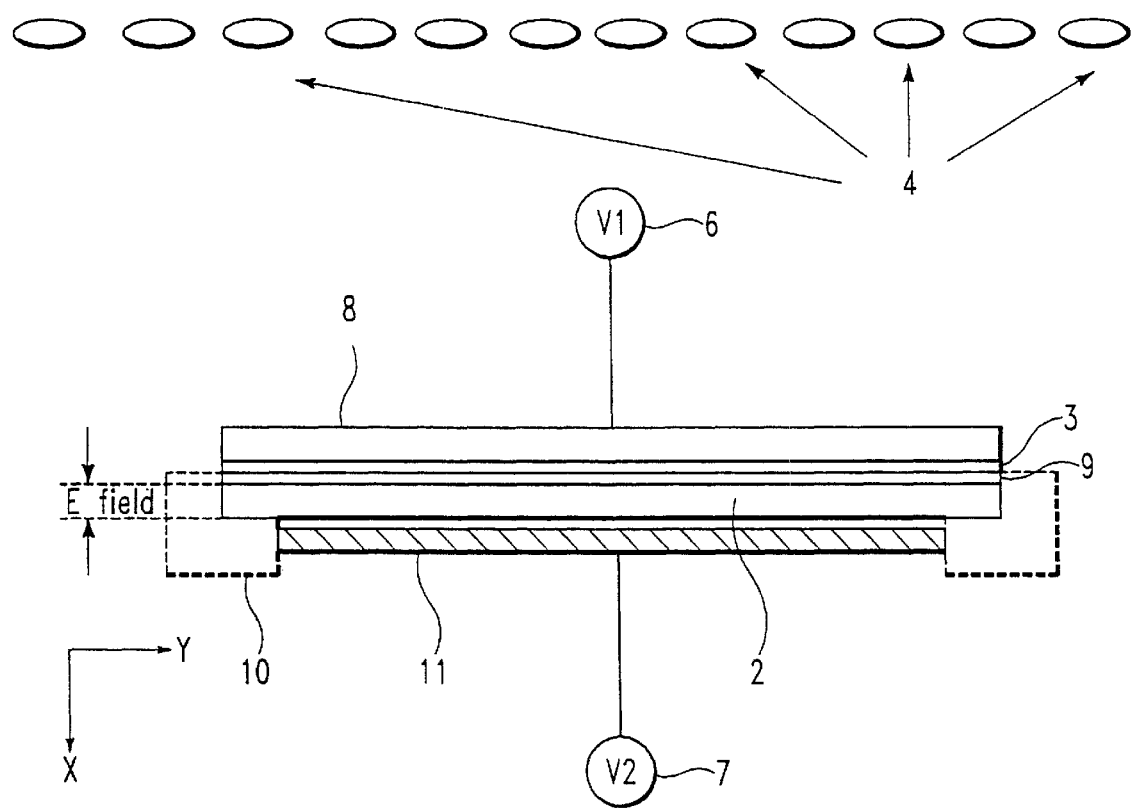
Figure 1C:
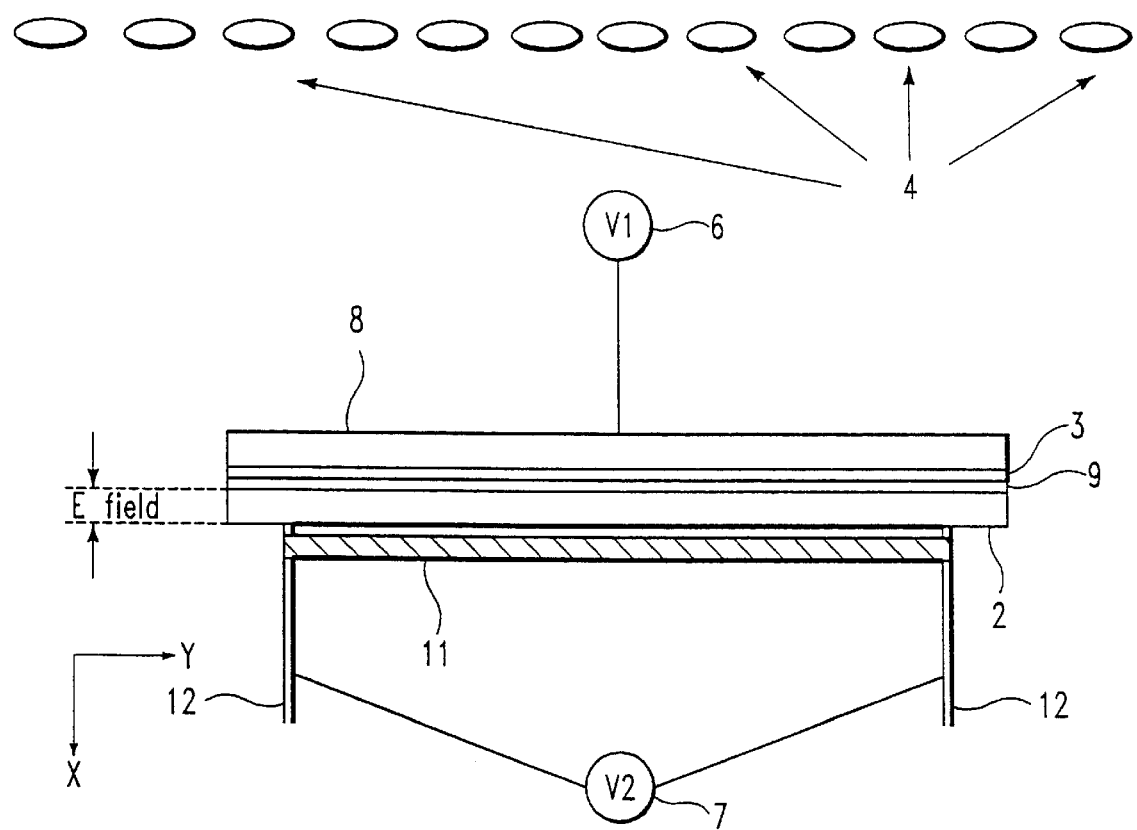

Alternatively, the chuck may include a portion that includes a surface that includes at least one passage that is open, exposing at least a portion of the semiconductor substrate. That is, the wafer may be mounted, for example, via its edge on an annular chuck, as shown in FIG. 1b, or by means of quartz pins, as shown in FIG. 1c, in a fashion well-known in the art. Along these lines, the chuck may include an annular portion that includes a large opening concentric with the annular portion. Such a large single opening could have a size about as large as the semiconductor substrate, such that the annular portion only engages the semiconductor substrate in the vicinity of the periphery of the semiconductor substrate.

FIG. 1b. represents a cross-sectional view of another embodiment similar to the embodiment shown in FIG. 1a, except that the wafer is mounted on an annular metal chuck 10, which contacts only the periphery of the object wafer. The chuck also includes a substrate grid 11 attached to the chuck 10 under the object wafer 2. In this case the annular metal chuck forms the second electrode.

FIG. 1c. represents a cross-sectional view of another embodiment similar to the embodiment shown in FIG. 1a. However, in FIG. 1c, the wafer is mounted horizontally on supporting pins 12. According to one embodiment, the pins are hollow quartz pins. Of course, the pins may be made of other materials and have other configurations. Typically, at least three or four pins support the wafer, two of which are shown in FIG. 1c. Tungsten wire may be fed through the pins if they are hollow. The wire may contact the backside of the object wafer, which can rest upon the pins, thus forming the second electrode. A grid 11 may be attached to the pins and electrically connected to the wires.

As shown in FIGS. 1b and 1c, the chuck or a body arranged under the object wafer includes a central portion that includes a plurality of perforations. Along these lines, FIGS. 1b and 1c illustrate a grid of electrically conducting material connected to the annular chuck member or wafer supporting pins. The semiconductor substrate can contact the grid when placed on the chuck or pins. The grid may be comprised of tungsten wire or other suitable metal or alloy that does not melt or degrade in the temperature range of interest for annealing. The grid may be similar to the grid discussed below arranged in the vicinity of but not in contact with the semiconductor substrate.

The chuck may comprise a clamp. The clamp may be included in the annular member described above. The annular clamp may be made of any suitable material. Typically, the annular clamp is made of metal. A metal clamp ring may provide electrical grounding potential for the electric field.

The part of the clamp that protrudes laterally onto the top surface of the object wafer typically protrudes no more than about 0.5 mm and vertically above the surface no more than about 0.25 mm. The lateral protrusion typically is sufficient to provide mechanical stability and good electrical contact but not enough to impede the electric field produced by the top electrode described below. The vertical protrusion typically is minimized such that the top electrode can be brought into close horizontal proximity to the clamped object wafer. A clamp, such as that described herein, typically cannot be used if the source electrode is to contact the object wafer.

Utilizing an annular clamp may be desirable to reduce thermal mass, thereby helping to maximize the thermal ramp-down of the semiconductor substrate temperature itself. To help ensure that distribution of the electric field when utilizing this configuration will be uniform in the wafer plane, a fine grid of wires, similar to the one described below as used for the other plate of the electrical field, could be arrayed in contact with the semiconductor substrate and the annular chuck ring. Such a grid of wires can help to generate a much more uniform electric field, and minimize added thermal mass.

Figure 1D:
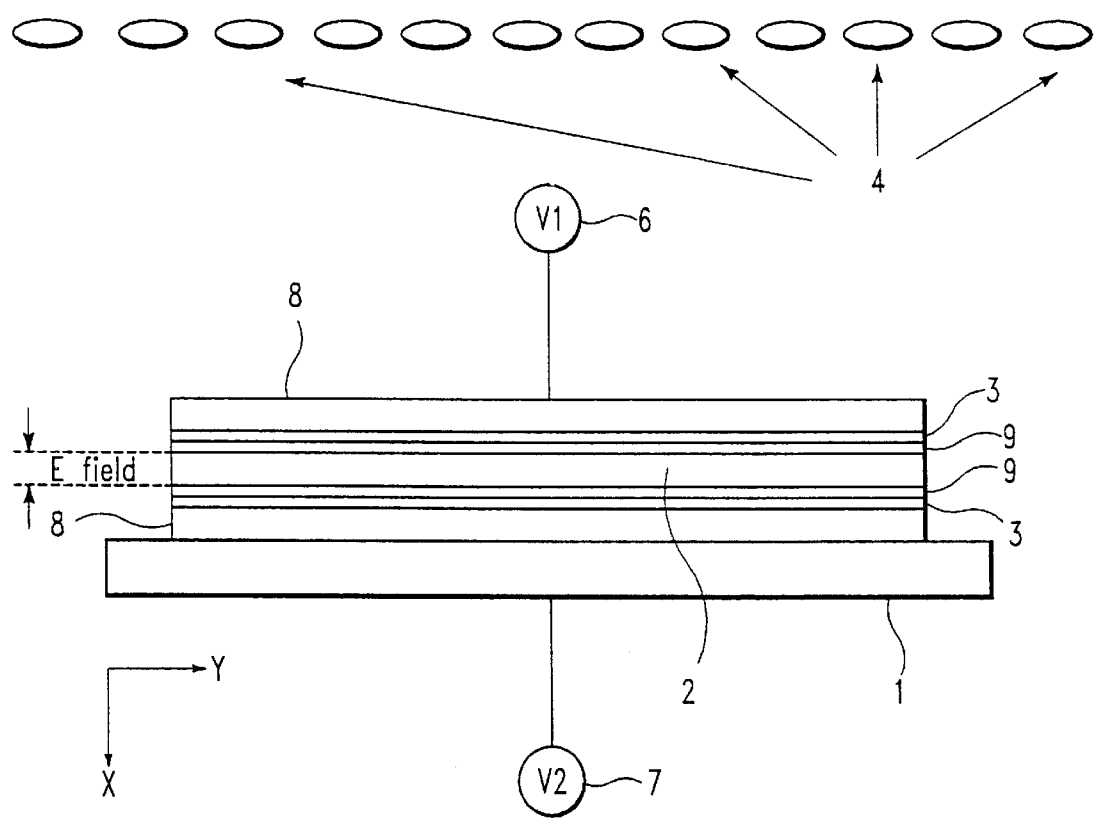

FIG. 1d shows yet another embodiment of the present invention wherein a field source wafer 8 is arranged on both sides of a object wafer. The object wafer sandwiched between the two field source wafers is arranged on the chuck 1. If it is desired to create a uniform field, then a field source wafer typically would be utilized.

Figure 2A:
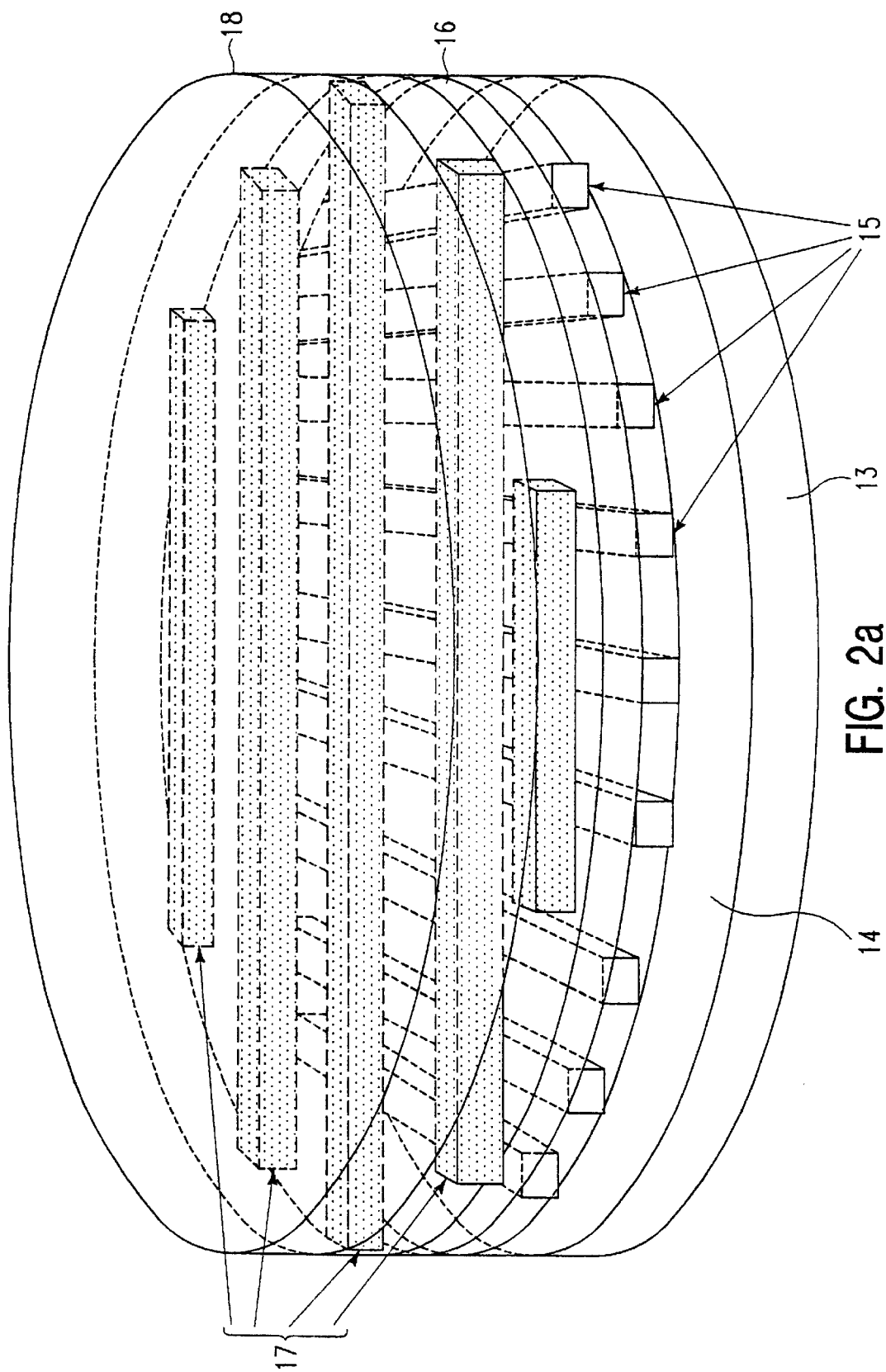
FIGS. 2a, 2b, 2c, and 2d represent overhead perspective views of four different embodiments of arrangements according to the present invention.
Figure 2B:
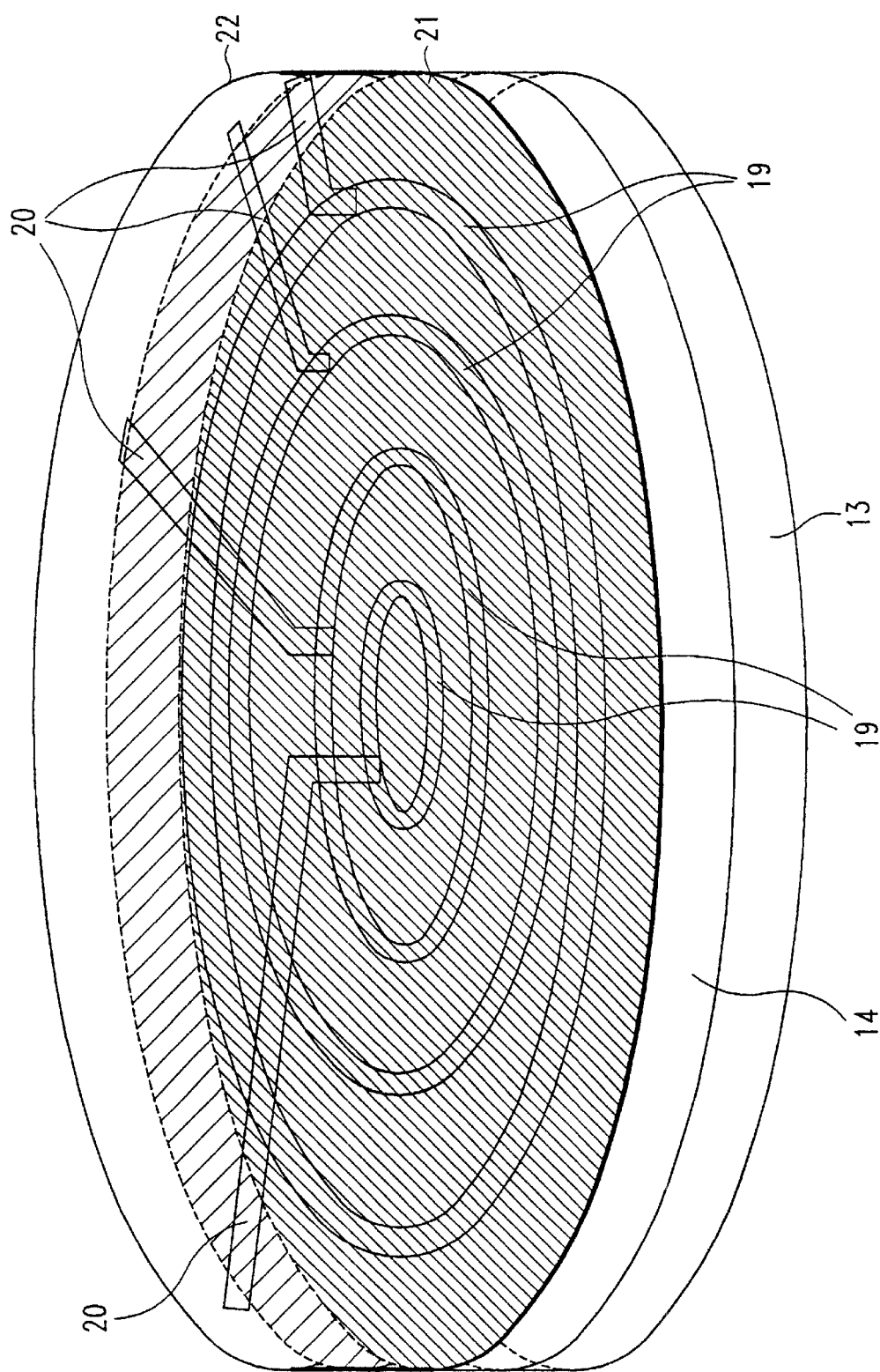
Figure 2C:
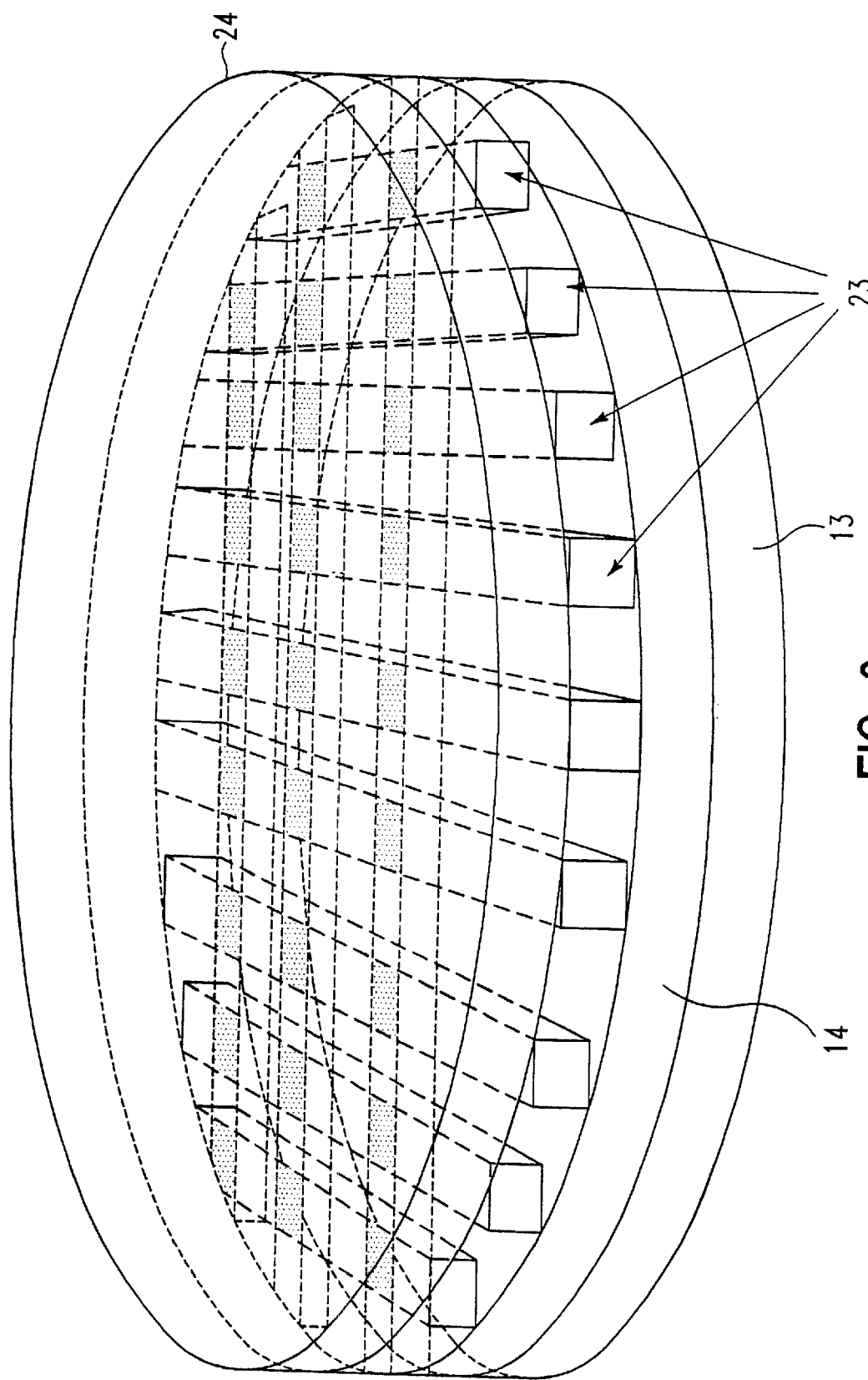

Generating the electric field can also include arranging a grid of an electrically conducting material such as wires illustrated in FIGS. 2a, 2b, and 2c, or a conducting plate, which could be comprised of a thin film of metal. If it is desired to create a spatially varying field, a grid field source typically would be utilized. The grid or plate typically is arranged adjacent to but not in contact with at least a portion of a surface of the semiconductor substrate. However, if the grid or plate is insulated with on oxide layer, contact is admissible, so long as there are protruding portions of a clamp, as described immediately above, which would prevent contact.

The grid, as the term implies, includes a plurality of passages therethrough. The grid passages are actual passages in the sense that the thermal radiation emitted the annealing lamps can pass through them with little attenuation. However, in the case where the top electrode is formed by the continuous metal-quartz/oxide layer stack, the thermal radiation is blocked directly from the object wafer. However, thermal conduction through the stack is known to take only about 0.5 sec to propagate through these layers to the object wafer, where some of the radiation is ultimately absorbed as useful heat for the dopant annealing, which is the object of the present invention.

The grid may be made of a suitable conducting material and may be configured in a grid-quartz or -oxide layer stack as illustrated in FIGS. 2a, 2b, and 2c. Typically, the metal or other suitable metal or alloy is immune from melting and/or warping at the desired annealing temperatures. According to one example, the grid is made of tungsten. Other suitable refractory metals and alloys that have a sufficiently high melting point include chromium (Cr), nickel (Ni), platinum (Pt), and titanium (Ti), and NiCr.

The first wire-grid level shown in FIG. 2a may be separated from the field source wafer substrate by a distance of about 10 nm to about 100 nm of deposited quartz or oxide. The first wire-grid level may comprise a pattern of parallel tungsten wires having a thickness of about 100 nm to about 500 nm. The width of the wires parallel to the plane of the wafer may be defined by the desired degree spatial variation of the applied electric field. However, it is typically desirable that the width is sufficient to permit a wire-bond to an external wire, such as a tungsten or copper wire, at one end of each respective wire.

These external wires may be connected to a DC or AC voltage source for generating the electric field.

FIG. 2a represents a perspective view of an embodiment of an apparatus of the present invention, wherein the tungsten layer is patterned as a rectangular grid. A thin layer 14, such as on the order of about 100 nm, of quartz or oxide may be deposited on a bare silicon wafer 13. Deposition of the quartz or oxide layer 14 may be followed by formation of a layer of parallel tungsten wires 15. The wires may be formed by a simple masking process.

Another thin layer 16, such as on the order of about 100 nm, of deposited quartz or oxide may separate orthogonal columns 17 of tungsten wires formed in the same way. Contacts to the wires may be formed via wire bond. A further layer 18 of quartz or oxide may be deposited on the second wire grid level 17. The rows and columns can then be individually biased and form one electrode of the DC electric field source. The resulting field impinging on the object wafer may be controllably spatially varying in the plane of the object wafer. The backside of object wafer may be supported as illustrated in FIGS. 1*a*, 1*b*, 1*c*, or 1*d*.

The wire-grid level itself may be formed by depositing tungsten metal of desired thickness, such as in the range described above, and then patterning the metal using standard mask and etch processes which are well known in the art. The second wire-grid level may be separated from the first by another approximately 10 nm to 100 nm of deposited quartz or oxide. This typically requires depositing quartz or oxide to a thickness of at least about the thickness of the wires plus the about 10 nm to about 100 nm extra to provide the spacing to the next level. Optionally, even more quartz or oxide can be deposited, but polished back to a desired thickness, as is well known in the art. The tungsten wires on the second level may then be formed in a manner similar to the first, but with the wires running orthogonal to the wires in the first layer. Another about 100 nm to about 500 nm film of oxide or quartz may be deposited over the second wire-grid level to passivate it to prevent shorting to the underlying wafer to be annealed, which will underlay this field-source wafer described above.

FIG. 2*b* represents a perspective view of another embodiment of a grid, wherein the grid is formed in an annular pattern. The annular grid 19 shown in FIG. 2*b* may be formed in analogous fashion to the rectangular grid of FIG. 2*a*. The base wafer 13, the annular wiring layer 19 and the radial wiring layers 20 may be separated by deposited films 21 and 22 of quartz or oxide. Connection between individual annuli and radii may be made with vias between the layers. Wire bonds may form contacts to the radial wires for AC or DC biasing. Here the annular wires may be biased individually via the radial wires.

The radial grid, such as the embodiment shown in FIG. 2*b*, may be formed in a manner similar to that described above for the rectangular pattern, but with appropriate mask definition as is well known in the art.

FIG. 2*c* illustrates an embodiment that represents a simplification of the embodiment shown in FIG. 2*a*. In the embodiment shown in FIG. 2*c*, only one layer of tungsten wire 23 is used. A layer 24 of quartz or oxide may be arranged on top of the wire grid 23. The wires in the embodiment shown in FIG. 2*c* are patterned in a crosshatch fashion and are, therefore, connected at the wire intersections. Thus, the wires for a rectangular grid that when electrically biased are at an equipotential.

Figure 2D:
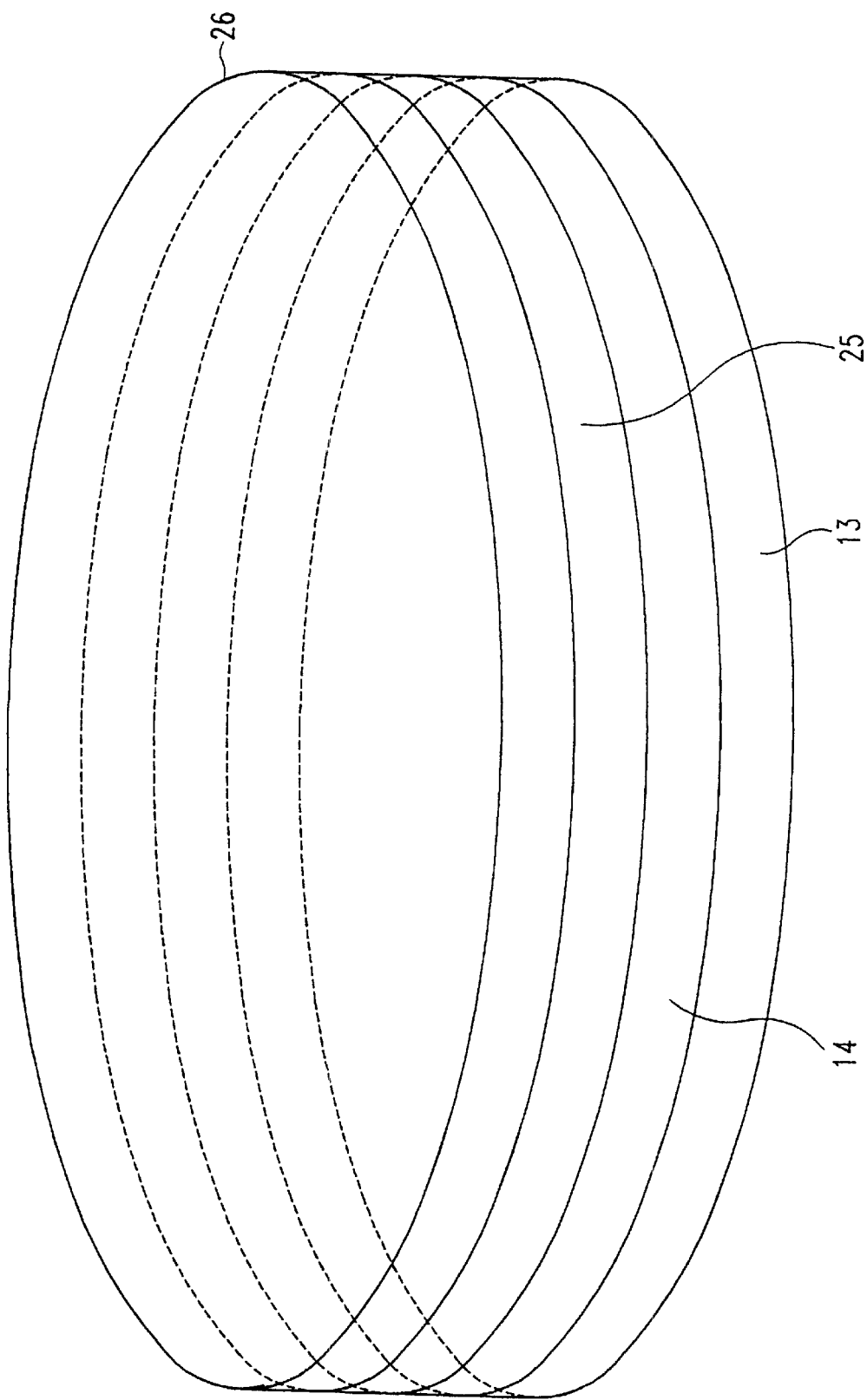

FIG. 2*d* illustrates an embodiment where the grid shown in FIGS. 2*a*, 2*b*, and 2*c* is replaced with a film 25. The film may be made of tungsten or any other suitable metal or alloy, such as those described herein. A layer 26 of quartz or oxide is arranged on top of the film 25.

The continuous metal film 25 shown in FIG. 2*d* may be formed via a simple variant of the above processes, which typically does not require patterning or a second layer of metal. However, this single metal layer typically must be passivated as described above to prevent shorting to the underlying wafer to be annealed.

A further variation of the present invention can include a screening layer that inhibits penetration of the applied electric field into the wafer being treated. The screening layer may comprise any material that can act to screen the wafer from the applied electric field. According to one embodiment, the screening layer comprises a metal layer metal deposited over an oxide layer. The metal layer may be thick. For example, the metal layer may have a thickness of more than 500 nm. Any suitable metal may be utilized. According to one example, the metal includes a tungsten film. A "field screen mask" as described above permits only selective areas of the object wafer to be subjected to the electric field anneal assist.

Figure 3:
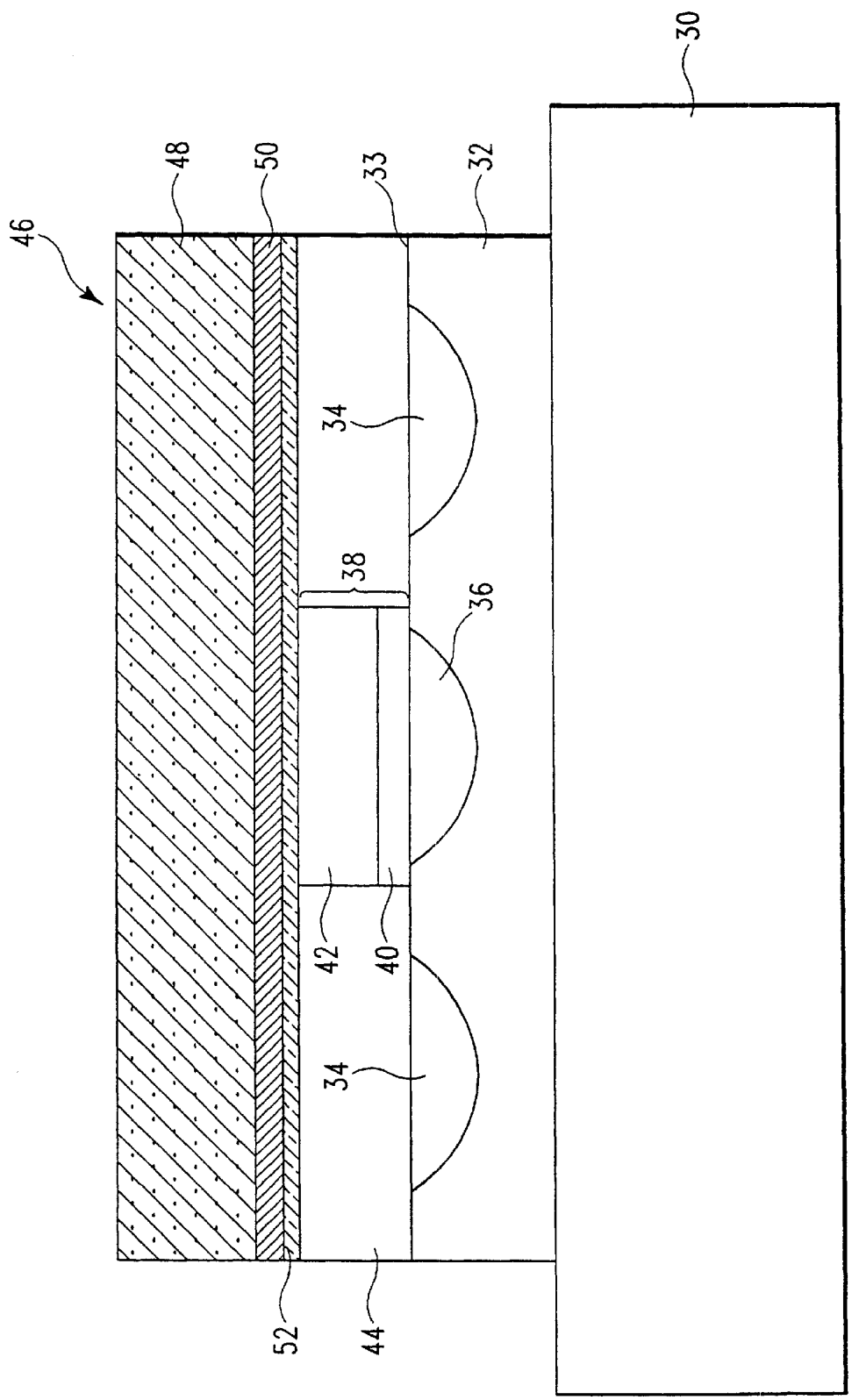
FIG. 3 represents a cross-sectional view of another embodiment of an arrangement according to the present invention.

FIG. 3 illustrates a cross-sectional view of a semiconductor substrate that includes a two-part field screen mask or sacrificial layer on the surface of the semiconductor substrate. Along these lines, FIG. 3 illustrates a chuck 30 on which a semiconductor wafer 32 has been arranged. Regions of the semiconductor substrate have been doped with phosphorus 34 and boron 36.

The sacrificial layer 38 is a two-part layer. Along these lines, the sacrificial layer includes an oxide layer 40 and a metal layer 42. The sacrificial layer is provided extending on the surface 33 of the wafer 32 beyond the edges of the boron region 36, but away from the phosphorus region 34. In FIG. 3, an optional layer 44 of quartz or oxide is shown on either side of the metal oxide masked boron-doped region. This provides a planar surface on which to contact or align the field source grid/metal stack 46.

The embodiment of the field source grid/metal stack shown in FIG. 3 comprises a wafer 48 with a layer 50 of tungsten metal 50 on the wafer and an oxide/quartz layer 52 on the metal layer. Such a field source wafer is described above in greater detail. The masking scheme shown in FIG. 3 includes the sacrificial metal layer that screens the applied field from the underlying dopant in the wafer, preferentially masking the boron, while the dopant is fully exposed to the full effects of the electric field assist.

The field-source grid/metal stack may be arranged over a portion of the surface of a semiconductor substrate. Alternatively, the field-source grid/metal stack may be arranged only over portions of a semiconductor substrate. The field-source grid/metal stack could actually be made up of a plurality of sub grids. Arranging the field-source grid/metal stack or sub grids only over one or more selected portions of a semiconductor substrate could help to further control diffusion of the dopant(s).

The distance that the field-source grid/metal stack is arranged away from the semiconductor substrate may vary, depending upon the embodiment. As illustrated in FIGS. 1*a*, 1*b*, 1*c*, and 1*d*, the field-source grid/metal stack may be place in contact with the object wafer or may be arranged at a distance of about 100 nm to about 500 nm away from the semiconductor substrate. If the field-source grid/metal stack is arranged in contact with the semiconductor substrate, then the topmost quartz or oxide layer, illustrated in FIGS. 2*a*, 2*b*, 2*c*, and 2*d*, may provide the necessary insulation to prevent electronic current flow through the object wafer during the field-assisted anneal.

To help refine distribution of the electric field, the field-source grid may include a plurality of individually biasable wires. Additionally or alternatively, the grid may include a plurality of subgrids. The subgrids may themselves include individually biasable wires. The grid, each biasable wire and/or each subgrid may be connected to a source of electric potential to generate a spatially varying electric field in the plane of the wafer, between the chuck/lower grid and the field source grid, for example, as shown in FIGS. 1a, 1b, 1c, and 1d. In the case of the field source consisting of the uniform metal film sandwiched between two insulating quartz/oxide layers, the electric field at the surface of the object wafer may be uniform in the plane of the object wafer.

Furthermore, electrical contact may be made to the grid or sub grids at a plurality of locations. Each location may be separately biasable. Depending on the desired layout of the grid, the grid-wire components can, in principle be individually contacted via a wiring layout achieved in a fashion well known in the art. This may serve to further refine the control of the electric field and, hence, the diffusion of dopants.

As stated above, the grid, regardless of its construction typically has a size sufficient to cover the entire surface of the semiconductor substrate. Such a grid can produce a constant electric field at the surface of the wafer and normal to it.

To generate a DC or one-dimensional AC electric field normal to the surface of the semiconductor substrate, the field-source grid/metal stack is arranged parallel to the surface of the semiconductor substrate. If the DC or one-dimensional AC electric field is to be at an angle to the surface of the semiconductor substrate then the grid and the substrate will be arranged at an angle relative to each other. As described previously, the angle may be restricted to be less than $J_{max}$.

The strength of an applied DC electric field when used may vary, depending upon the embodiment. One factor that may affect the field strength is the desired degree of enhancement or retardation of diffusion of dopants that is desired. Typically, the DC electric field will have a strength of about 0.01 MV/cm to about 1.0 MV/cm at the surface of the semiconductor substrate. For shallow junction semiconductor technologies, that is, for dopant pockets less than about 0.25 mm deep, it is well-known in the art that the annealing temperature is in the range of, typically, about 900° C. to about 1150° C. and annealing times are in the range of about 0.5 sec to about 10 sec. In this case, a field of magnitude +/−0.01 MV/cm is recommended in order to enhance/retard n+ dopant, such as phosphorus or arsenic, for example. The retardation/enhancement is reversed for p+ dopants, such as boron. Higher fields, such as on the order of about 0.1 to about 1.0 MV/cm, may be required to affect the diffusion/annealing of dopants that have been implanted deep into the substrate. The field strength below the surface of the substrate of the object wafer may vary with depth into the substrate due to carrier screening. The field strength above and below the surface may actually vary.

As referred to above, the method according to the present invention may include varying and/or reducing the DC or AC electric field strength on selected portions of the semiconductor substrate. The can permit local control of the diffusion of the dopant species. The DC or AC electric field may be controlled in a variety of ways.

One way to control the DC electric field strength is to provide at least one sacrificial layer on at least one portion of a surface of the semiconductor substrate where the dopants have been implanted. Any material that can control the DC or AC electric field strength may be utilized, which is immune to melting, degradation, and/or decomposition at the desired annealing temperature. Typically, the sacrificial layer reduces the DC or AC electric field strength. The at least one sacrificial layer may include a metal layer. As previously mentioned, the refractory metals tungsten, chromium, nickel, platinum, and the alloy NiCr, are examples of such metals.

The at least one sacrificial layer may also include a layer of at least one dielectric material. The dielectric layer would lie on the surface of the semiconductor substrate between the metal layer and the semiconductor substrate. Any dielectric material may be utilized in the dielectric layer. Examples of dielectric materials that may be utilized in the at least one sacrificial layer include at least one nitride and/or at least one oxide. The sacrificial layer(s) may be applied with standard photolithography masking techniques.

The thickness of the dielectric layer may vary, depending upon the embodiment. Typically, the dielectric layer has a thickness of about 20 nm. More typically, the dielectric layer has a thickness of about 10 nm to about 100 nm.

Similarly, the thickness of the metal layer may vary, depending upon the embodiment. The typical thicknesses are described above.

The thickness and composition of the sacrificial layer are sufficient to result in the desired effect on the DC electric field.

One or more heat sources may be utilized for annealing the substrate and dopant(s). The heat source(s) may be arranged on an opposite side of the semiconductor substrate as the side that the dopant(s) have been introduced in. The side that the at least one heat source is arranged opposite may be opposite the grid as well.

Rather than utilizing a sacrificial layer, the field-source grid/metal stack could be engineered to lie in close proximity to the semiconductor substrate surface but without contacting it. The grid could further be engineered to be an array of much smaller grids which could be selectively activated, or biased, to produce the necessary field locally in desired regions of the wafer. Utilizing subgrids could even permit control on the scale of individual chips on a wafer. This could be extreme value in controlling wafer level excursions in device behavior arising from other sources.

The present invention also provides an apparatus for forming a desired junction profile in a semiconductor substrate. The apparatus according to the present invention may carry out the method described above. Along these lines, an apparatus according to the present invention includes means for annealing a semiconductor substrate in which at least one dopant species has been introduced. The annealing means includes at least one heat source.

FIGS. 1a, 1b, 1c, and 1d illustrate several different embodiments of the apparatus according to the present invention. The embodiment of the apparatus illustrated in FIG. 1a includes an electrically conducting chuck 1 supporting a semiconductor substrate 2, in this case, a semiconductor wafer. The chuck may be as described above. Along these lines, the chuck may comprise an annular ring that leaves the top and bottom surfaces of the object wafer exposed, as shown in FIG. 1b. Similarly, the chuck and, hence, the semiconductor substrate may rotate. Rotation can help to ensure uniformity of processing over the entire semiconductor substrate, if desired.

As illustrated in FIG. 1b, a wire grid 3 fabricated of electrically conducting material, such as one of the refractory metals referred to above, can be arranged within the annular chuck on the side opposite of the field-source grid/metal stack. This grid does not necessarily have to be in contact with the wafer. Alternatively, as illustrated in FIG. 1c, such a wire grid can underlie the object wafer in lieu of the chuck, but not necessarily be in contact with the wafer. In the latter case, as shown in FIG. 1c, the wafer may be supported on hollow quartz pins through which tungsten wire can be fed to provide contact to the DC potential source V2. FIG. 1d illustrates another embodiment wherein a duplicate field source gird/metal stack is mounted underlying the object wafer in lieu if the chuck or wire grid shown in FIGS. 1a, 1b, and 1c. In every case, the potential source V2 may be applied to the underlying chuck, grid, or field-source grid/metal stack.

A plurality of lamps 4 is arranged to provide heat to anneal the substrate and implanted dopant(s). The heat source(s) could be arranged anywhere about the chuck and supported semiconductor substrate. Along these lines, the heat source(s), such as the lamps illustrated in FIG. 1 could alternatively or additionally be arranged on the opposite side of the chuck as shown in FIG. 1. Arranging the lamps on the opposite side of the chuck as shown in FIG. 1 can make interference between the wire grid array and the device side, or top, of the wafer less likely.

However many heat sources are utilized, the heat sources may be capable of carrying out the processes described above.

To generate the DC or AC electric field, both the grid 5 and the chuck 1, alone or together with the grid 3, may be connected to at least one voltage source 6 and 7, respectively. The voltage sources may be connected to the individually biasable wires or subgrids described above. The voltage sources generate the electric field between the grid 5 and the chuck/grid 3. The electric field in the embodiment illustrated in FIGS. 1a, 1b, 1e, and 1d is normal to the surface of the semiconductor substrate. As stated above, the grid and/or semiconductor substrate may be arranged such that they are at an angle with respect to each other to control lateral diffusion as well as vertical diffusion as well as the ratio of vertical to lateral diffusion, as shown in FIG. 5.

Figure 5:
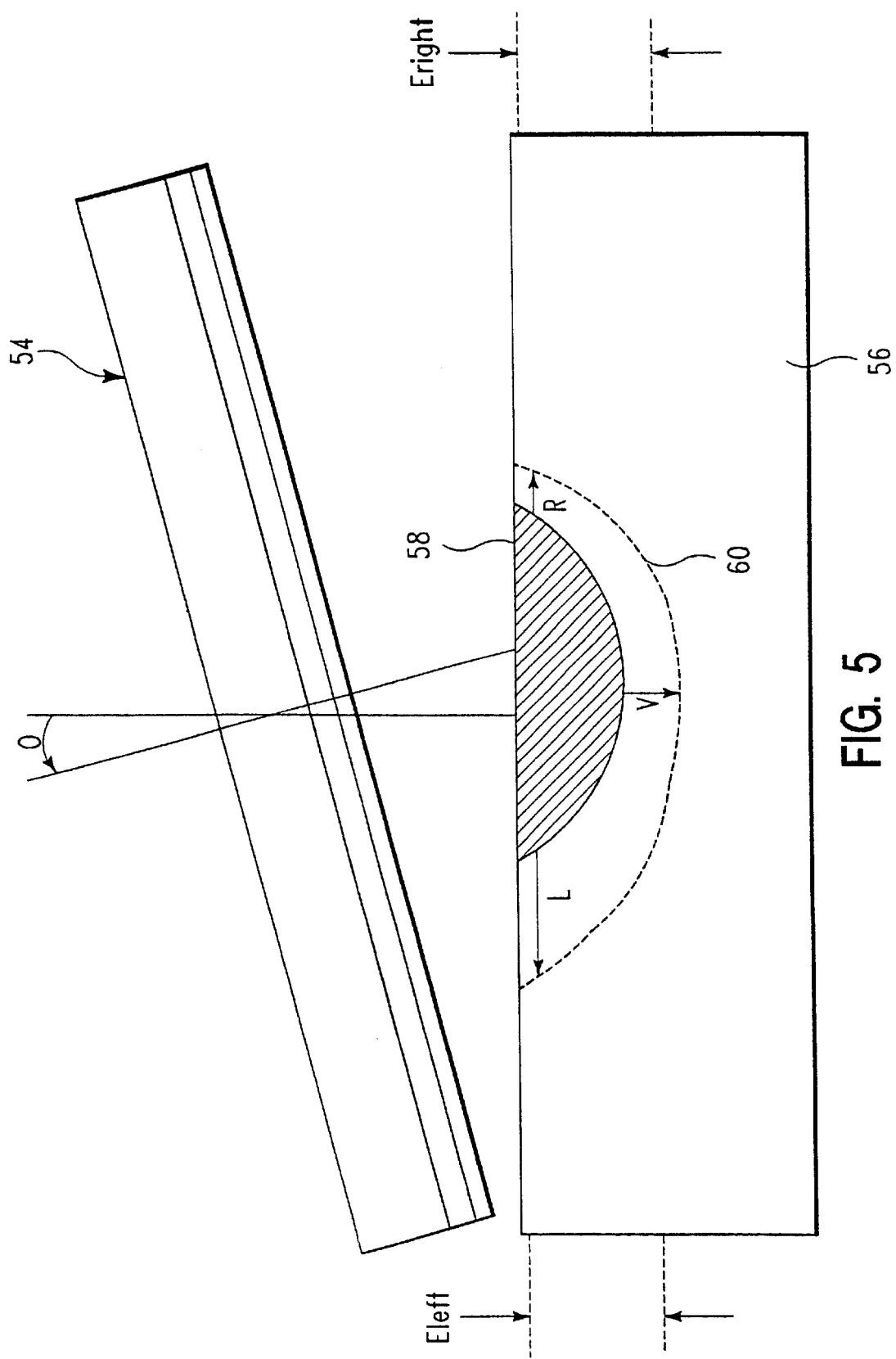
FIG. 5 represents a cross-sectional view of yet another embodiment of an arrangement according to the present invention.

FIG. 5 illustrates an embodiment wherein lateral diffusion is being carried out/controlled. For example, FIG. 5 shows the effect of tilting the field-source grid/metal stack 54 at an angle θ with respect to a line normal to surface of the object wafer 56. The resulting electric field in the object wafer 56 is, therefore, asymmetric, as shown in FIG. 5. Along these lines, the field is stronger on the left of the dopant pocket 58 than on the right. The out-diffused dopant profile 60 in two-dimensions is, therefore, asymmetric, having diffused a distance L on the left, which is farther on than the diffusion distance on the right R. With respect to the vertical outdiffusion distance V, the ratio is, therefore, unequal left-to-right.

The chuck, lamps, grids, and other elements of the apparatus typically are provided in a processing chamber (not shown). Utilizing a processing chamber can permit control of all conditions within the processing chamber. Along these lines, an apparatus according to the present invention can include a pump for controlling the pressure within the processing chamber. The apparatus could also include at least one gas source for introducing any desired gas(es) into the processing chamber.

In the embodiments illustrated in FIGS. 2a and 2c, contact to a desired potential source may be made to each individual wire in the grid via a wire bond at each end of the wire. Each potential source may have a unique strength, thus providing a spatially variable field in the plane of the surface of the object wafer. In the embodiment shown in FIG. 2b, each wire annulus on the first grid layer may be contacted via the radial wires on the second level.

Contact may be made through vias etched through the intervening quartz or oxide by means well known in the art. Wirebond contact to a potential source may be made at the free end of each of the radial wires. The potential source for each radial wire can be unique as in the embodiment represented in FIG. 2a.

In the embodiments illustrated in FIGS. 2a, 2b, and 2c, the metal grid film may be deposited on a film of oxide or quartz. The grid may be formed via masking techniques well known in the art. In the embodiments shown in FIGS. 2b and 2b, an intervening layer of quartz or oxide is deposited between the overlying second metal grid.

The embodiment shown in FIG. 2c does not include a second grid layer. Also, the embodiment represented in FIG. 2d does not include a grid. In both of the embodiments shown in FIGS. 2c and 2d, no intervening layer of quartz or oxide is necessary.

The electric field developed by the grid of FIG. 2c is, by definition, periodic in the plane of the object wafer. On the other hand, the electric field developed by the uniform film represented in FIG. 2d is uniform and constant, spanning the entire surface of the object wafer.

Advantages for local control of dopant diffusion on the object accrue given the variety of options presented by the above invention.

The strength of the DC or AC electric field at the surface of the semiconductor substrate may vary. Typically, the DC or AC electric field has a strength of about 0.01 MV/cm to about 1.0 MV/cm. The polarity depends upon the dopant type and is chosen so as to drive the ionized species to the surface creating the desired shallow junction or away from the surface in cases where diffusion enhancement is desirable. Fields greater than about 1.0 Mv/cm may result in break down and/or damage to any thin gate oxide that may be present on the wafer. Typically, oxide with a thickness of less than 4.0 mn is considered "thin".

As stated above, the DC or AC electric field strength may vary from above the surface to at the surface to below the surface of a semiconductor substrate. For example, in oxide on a silicon wafer, the electric field may have a value of about 3.9*E, where E is the applied field strength in air or vacuum. In the silicon itself, the field has a value of about 11.9*E.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A device for forming a desired junction profile in a semiconductor substrate, the device comprising:
   a means for annealing a semiconductor substrate in which at least one dopant has been diffused, the annealing means comprising at least one heat source; and
   means for producing a DC or AC electrical field and exposing the semiconductor substrate to the DC or AC electrical field simultaneous with the annealing.

2. The device of claim 1 whererin the electrical field is an AC electrical field.

3. The device of claim 1 wherein the electrical field is a AC electrical field.

4. The device of claim 1 wherein the electrical field is a one-dimensional electrical field.

5. The device of claim 1 wherein the electrical field is a DC electrical field.

6. The device according to claim 1, further comprising means for diffusing the at least one dopant into the semiconductor substrate.

7. The device according to claim 1, wherein the electrical field generating means generates a DC electric field at an upper surface of the semiconductor substrate and normal to the upper surface of the semiconductor substrate.

8. The device according to claim 1, wherein the electrical field generating means comprises:

an electrically conducting chuck on which the semiconductor substrate is arranged;

means for biasing the chuck;

at least one grid of an electrically conducting material arranged adjacent to at least a portion of at least one surface of the semiconductor substrate when the semiconductor substrate is arranged on the chuck; and means for biasing the at least one grid.

9. The device according to claim 1, wherein the electrical field generating means comprises:

an electrically conducting chuck on which the semiconductor substrate is arranged;

means for biasing the chuck;

at least one field source wafer arranged adjacent to at least a portion of at least one surface of the semiconductor substrate when the semiconductor substrate is arranged on the chuck; and means for biasing the at least one field source wafer.

10. The device according to claim 8, wherein the at least one grid is larger than an entire upper surface of the semiconductor substrate.

11. The device according to claim 8, wherein the grid is separated from the semiconductor substrate by a distance of about 100 nm to about 500 nm when the semiconductor substrate is arranged on the chuck.

12. The device according to claim 8, wherein the at least one grid comprises a plurality of individually biasable wires and wherein the grid biasing means individually biasing the wires.

13. The device according to claim 1, further comprising:

means for reducing the strength of the electrical field on selected portions of the semiconductor substrate.

14. The device according to claim 1, wherein the electrical field has a strength of about 0.01 MV/cm to about 1.0 MV/cm at an upper surface of the semiconductor substrate.

15. The device according to claim 1 wherein the electrical field is an AC electrical field having a frequency of 60 HZ or less.

16. The device according to claim 14, further comprising:

means for controlling wherein lateral diffusion of the at least one dopant with the electrical field.

17. The device according to claim 6, wherein the means for controlling lateral diffusion of the at least one dopant comprises:

means for producing the electrical field at an upper surface of the semiconductor substrate and at an angle with respect to an upper surface of the semiconductor substrate.

18. The device according to claim 17, wherein the electrical field is produced at an angle of up to about 15° with respect to the upper surface of the semiconductor substrate.

19. The device according to claim 1, further comprising:

means for rotating the semiconductor substrate during the annealing and exposing to the electrical field.

20. The device according to claim 8, wherein the at least one heat source is arranged on a side of the semiconductor substrate opposite the grid.

21. The device according to claim 1, wherein the chuck comprises an annular clamp for clamping the semiconductor substrate and a grid of an electrically conducting material connected to the annular clamp.

* * * * *

UNITED STATES PATENT AND TRADEMARK OFFICE
CERTIFICATE OF CORRECTION

PATENT NO. : 6,552,411 B2
DATED : April 22, 2003
INVENTOR(S) : Ballantine et al.

It is certified that error appears in the above-identified patent and that said Letters Patent is hereby corrected as shown below:

<u>Column 16, lines 60-67 through Columns 17 and Column 18, lines 1-39,</u>
Please substitute the claims as printed in the patent with the following claims:

1. A method for forming a desired junction profile in a semiconductor substrate, comprising:

introducing at least one dopant into the semiconductor substrate; and then diffusing the at least one dopant by annealing the semiconductor substrate while exposing the semiconductor substrate to a DC or AC field.

2. The method of claims 1 wherein the electrical field is an AC electrical field.

3. The method of claim 1 wherein the electrical field is a DC electrical field.

4. The method of claim 1 wherein the electrical field is an AC electrical field having a frequency of 60 HZ or less.

5. The method of claim 4 wherein the frequency is about 0.5 to about 60 HZ.

6. The method according to claim 1, wherein the dopant is implanted by ion implantation.

7. The method according to claim 1, wherein the anneal is a rapid thermal anneal.

8. The method according to claim 3, wherein the DC electric field retards dopant diffusion.

9. The method according to claim 3, wherein the DC electric field enhances dopant diffusion.

10. The method according to claim 1, wherein the electric field is produced at an upper surface of the semiconductor substrate and normal to the upper surface of the semiconductor substrate.

11. The method according to claim 1, further comprising:

arranging the semiconductor substrate on an electrically conducting chuck that provides a source of electrical potential;

arranging at least one grid of an electrically conducting material adjacent at least a portion of a surface of the semiconductor substrate; and biasing the at least one grid and the electrically conducting chuck to create the AC or DC electrical field.

12. The method according to claim 1, further comprising:

arranging a field source wafer adjacent at least one surface of the semiconductor substrate; and biasing the field source wafer.

UNITED STATES PATENT AND TRADEMARK OFFICE
CERTIFICATE OF CORRECTION

PATENT NO. : 6,552,411 B2
DATED : April 22, 2003
INVENTOR(S) : Ballantine et al.

It is certified that error appears in the above-identified patent and that said Letters Patent is hereby corrected as shown below:

13. The method according to claim 11, wherein the grid is arranged over an entire upper surface of the semiconductor substrate.

14. The method according to claim 11, wherein the grid is arranged such that it is separated from the semiconductor substrate by a distance of about 100 nm to about 500 nm.

15. The method according to claim 11, wherein the grid comprises a plurality of individually biasable wires and the method further comprises individually biasing the wires.

16. The method according to claim 11, wherein the grid comprises tungsten.

17. The method according to claim 1, further comprising:

reducing the strength of the DC or AC electric field on selected portions of the semiconductor substrate.

18. The method according to claim 17, wherein reducing the field strength comprises:

providing at least one sacrificial layer on portions of an upper surface of the semiconductor substrate to shield the at least one dopant from the electrical field.

19. The method according to claim 18, wherein the at least one sacrificial layer comprises a metal layer on the portions of the upper surface of the semiconductor substrate.

20. The method according to claim 19, where in the sacrificial layer further comprises a layer of dielectric material on the upper surface of the semiconductor substrate between the metal layer and the semiconductor substrate.

21. The method according to claim 1, wherein the electrical field has a strength of about 0.01 MV/cm to about 1.0 MV/cm at an upper surface of the semiconductor substrate.

22. The method according to claim 3, wherein the DC electric field is positive.

23. The method according to claim 3, wherein the DC electric field is negative.

24. The method according to claim 1, wherein the method is carried out at a pressure of about 1 atmosphere or less.

25. The method according to claim 1, wherein lateral and vertical diffusion of the dopants is controlled with a DC electrical field or AC-electrical field.

26. The method according to claim 25, wherein controlling lateral diffusion of the dopants comprises:

producing the DC electrical field or AC electrical field at an upper surface of the semiconductor substrate and at an angle with respect to an upper surface of the semiconductor substrate.

27. The method according to claim 26, wherein the electric field is at an angle of up to about 15° with respect to the upper surface of the semiconductor substrate.

UNITED STATES PATENT AND TRADEMARK OFFICE
CERTIFICATE OF CORRECTION

PATENT NO. : 6,552,411 B2
DATED : April 22, 2003
INVENTOR(S) : Ballantine et al.

It is certified that error appears in the above-identified patent and that said Letters Patent is hereby corrected as shown below:

28. The method according to claim 27, further comprising:

rotating the semiconductor substrate during the annealing and exposing to the DC electric field.

29. The method according to claim 1, wherein the annealing is carried out at a temperature of about 900°C to about 1150°C.

30. The method according to claim 1, wherein the annealing is carried out for about 0.5 seconds to about 10 seconds.

31. The method according to claim 29, wherein the temperature of about 900°C to about 1150°C is maintained for about 0.5 seconds to about 10 seconds.

32. The method according to claim 29, wherein the temperature is ramped down to room temperature from the temperature of about 900°C to about 1150°C over a period of time of about 10 seconds to about 60 seconds.

Signed and Sealed this

Nineteenth Day of August, 2003

JAMES E. ROGAN
*Director of the United States Patent and Trademark Office*